(12) United States Patent  
Suzuki

(10) Patent No.: US 8,902,492 B2  
(45) Date of Patent: Dec. 2, 2014

(54) OPTICAL AMPLIFIER AND OPTICAL AMPLIFIER CONTROL METHOD

(71) Applicant: Fujitsu Limited, Kawasaki-shi, Kanagawa (JP)

(72) Inventor: Yuichi Suzuki, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 84 days.

(21) Appl. No.: 13/870,305

(22) Filed: Apr. 25, 2013

(65) Prior Publication Data
US 2013/0329277 A1 Dec. 12, 2013

(30) Foreign Application Priority Data

Jun. 12, 2012 (JP) ................................ 2012-133230

(51) Int. Cl.
*H04B 10/29* (2013.01)
*H01S 3/13* (2006.01)
(Continued)

(52) U.S. Cl.
CPC ........ *H04B 10/2941* (2013.01); *H04B 10/2916* (2013.01); *H01S 3/1312* (2013.01); *H01S 3/1317* (2013.01); *H01S 3/06754* (2013.01); *H01S 3/094096* (2013.01); *H01S 3/10023* (2013.01); *H01S 3/1301* (2013.01); *H01S 3/1305* (2013.01); *H01S 3/302* (2013.01); *H01S 5/06804* (2013.01); *H01S 3/094003* (2013.01); *H01S 3/09415* (2013.01); *H01S 3/1022* (2013.01); *H01S 5/141* (2013.01); *H01S 5/146* (2013.01); *H01S 3/10069* (2013.01)
USPC ................... 359/334; 359/337.11; 359/341.31

(58) Field of Classification Search
CPC ............ H04B 10/2916; H04B 10/2941; H01S 3/1301; H01S 3/1305; H01S 3/1312; H01S 3/1317; H01S 3/1608; H01S 3/302
USPC ........ 359/334, 341.3, 341.31, 341.32, 341.33
See application file for complete search history.

(56) References Cited

U.S. PATENT DOCUMENTS 5,541,766 A * 7/1996 Mizrahi et al. ................. 359/337
6,201,636 B1 * 3/2001 Noda ............................. 359/337
(Continued)

FOREIGN PATENT DOCUMENTS

JP 04-168907 6/1992
JP 08-262080 10/1996
(Continued)

*Primary Examiner* — Isam Alsomiri
*Assistant Examiner* — Ari M Diacou
(74) *Attorney, Agent, or Firm* — Staas & Halsey LLP

(57) ABSTRACT

An optical amplifier includes: a temperature-adjustment-unit that is provided in a wavelength-fixing-unit that fixes a center-wavelength of an excitation-light-source, and adjusts a temperature of the wavelength-fixing-unit, which causes the center-wavelength of the excitation-light-source to vary; a temperature-measurement-unit that measures the temperature of the wavelength-fixing-unit and a temperature of a gain-equalization-unit that equalizes gains of the signal-light on which the Raman amplification is performed using the excitation-light-source; a shift-amount-obtaining-unit that obtains a shift amount data of the center-wavelength of the excitation-light-source from a first-storage-unit and obtains a shift amount of the center-wavelength of the wavelength-band from a second-storage-unit; and a control unit that obtains a temperature-data of the-wavelength-fixing-unit, which corresponds to a difference between two shift amounts that are obtained by the shift amount obtaining unit, from the first-storage-unit, and controls the temperature of the wavelength-fixing-unit based on the obtained temperature-data.

5 Claims, 18 Drawing Sheets

(51) Int. Cl.
  *H04B 10/294* (2013.01)
  *H04B 10/291* (2013.01)
  *H01S 3/131* (2006.01)
  *H01S 3/067* (2006.01)
  *H01S 3/094* (2006.01)
  *H01S 3/10* (2006.01)
  *H01S 3/30* (2006.01)
  *H01S 5/068* (2006.01)
  *H01S 3/0941* (2006.01)
  *H01S 3/102* (2006.01)
  *H01S 5/14* (2006.01)

(56) References Cited

U.S. PATENT DOCUMENTS

| | | | |
|---|---|---|---|
| 6,621,623 B1 * | 9/2003 | Okuno | 359/341.1 |
| 6,900,930 B2 * | 5/2005 | Ovadia et al. | 359/337 |
| 7,233,712 B2 * | 6/2007 | Arellano | 385/14 |
| 7,336,415 B2 * | 2/2008 | Kakui et al. | 359/337.1 |
| 2001/0021300 A1 * | 9/2001 | Yoshida | 385/134 |
| 2002/0037131 A1 * | 3/2002 | Naganuma | 385/27 |
| 2002/0154387 A1 * | 10/2002 | Mori et al. | 359/337.1 |
| 2002/0171913 A1 * | 11/2002 | Batchko et al. | 359/333 |
| 2003/0214703 A1 * | 11/2003 | Ovadia et al. | 359/344 |
| 2003/0234976 A1 * | 12/2003 | Nishihara et al. | 359/337.1 |
| 2004/0042062 A1 | 3/2004 | Takeda et al. | |
| 2004/0196882 A1 * | 10/2004 | Nakaji et al. | 372/70 |
| 2012/0121256 A1 * | 5/2012 | Suzuki et al. | 398/34 |

FOREIGN PATENT DOCUMENTS

| | | |
|---|---|---|
| JP | 11-295365 | 10/1999 |
| JP | 2000-346891 | 12/2000 |
| JP | 2004-103599 | 4/2004 |

\* cited by examiner

FIG. 7

| FBG TEMPERATURE [°C] | | ... | −20 | 0 | 25 | 40 | 60 | 85 | ... |
|---|---|---|---|---|---|---|---|---|---|
| CENTER WAVELENGTH SHIFT AMOUNT [nm] | LD101a | ... | −0.55 | −0.23 | 0.00 | 0.14 | 0.35 | 0.58 | ... |
| | LD101b | ... | −0.54 | −0.23 | 0.00 | 0.17 | 0.34 | 0.60 | ... |
| | LD101c | ... | −0.56 | −0.26 | 0.00 | 0.12 | 0.32 | 0.57 | ... |
| | LD101d | ... | −0.56 | −0.24 | 0.00 | 0.14 | 0.34 | 0.59 | ... |

FIG. 8

| FBG TEMPERATURE [°C] | | ... | −20 | 0 | 25 | 40 | 60 | 85 | ... |
|---|---|---|---|---|---|---|---|---|---|
| CENTER WAVELENGTH OF EXCITATION LIGHT [nm] | LD101a | ... | 1457.45 | 1457.77 | 1458.00 | 1458.14 | 1458.35 | 1458.58 | ... |
| | LD101b | ... | 1466.46 | 1466.77 | 1467.00 | 1467.17 | 1467.34 | 1467.60 | ... |
| | LD101c | ... | 1487.44 | 1487.74 | 1488.00 | 1488.12 | 1488.32 | 1488.57 | ... |
| | LD101d | ... | 1498.44 | 1498.76 | 1499.00 | 1499.14 | 1499.34 | 1499.59 | ... |

OPTIMAL TEMPERATURE (25)

REFERENCE VALUE

FIG. 9

| GEQ TEMPERATURE [°C] | ... | −20 | 0 | 25 | 40 | 60 | 85 | ... |
|---|---|---|---|---|---|---|---|---|
| CENTER WAVELENGTH SHIFT AMOUNT [nm] | ... | −0.20 | −0.11 | 0.00 | 0.06 | 0.15 | 0.26 | ... |

FIG. 14

| LD CURRENT [mA] | | ... | 500 | 1000 | 1500 | 1800 | 2000 | ... |
|---|---|---|---|---|---|---|---|---|
| CENTER WAVELENGTH SHIFT AMOUNT [nm] | LD101a | ... | 0.00 | 0.20 | 0.34 | 0.33 | 0.38 | ... |
| | LD101b | ... | 0.00 | 0.17 | 0.30 | 0.33 | 0.36 | ... |
| | LD101c | ... | 0.00 | 0.13 | 0.24 | 0.28 | 0.28 | ... |
| | LD101d | ... | 0.00 | 0.21 | 0.36 | 0.44 | 0.43 | ... |

FIG. 15

| LD CURRENT VALUE [mA] | | ... | 500 | 1000 | 1500 | 1800 | 2000 | ... |
|---|---|---|---|---|---|---|---|---|
| CENTER WAVELENGTH OF EXCITATION LIGHT [nm] | LD101a | ... | 1458.00 | 1458.20 | 1458.34 | 1458.33 | 1458.38 | ... |
| | LD101b | ... | 1467.00 | 1467.17 | 1467.30 | 1467.33 | 1467.36 | ... |
| | LD101c | ... | 1488.00 | 1488.13 | 1488.24 | 1488.28 | 1488.28 | ... |
| | LD101d | ... | 1499.00 | 1499.21 | 1499.36 | 1499.44 | 1499.43 | ... |

OPTIMAL CURRENT VALUE: 500

REFERENCE VALUE

OPTICAL AMPLIFIER AND OPTICAL AMPLIFIER CONTROL METHOD

CROSS-REFERENCE TO RELATED APPLICATION

This application is based upon and claims the benefit of priority of the prior Japanese Patent Application No. 2012-133230, filed on Jun. 12, 2012, the entire contents of which are incorporated herein by reference.

FIELD

The embodiments discussed herein are related to an optical amplifier and an optical amplifier control method.

BACKGROUND

In the related art, an optical amplifier is known that is called a Raman amplifier that amplifies signal light using an excitation light source. In the Raman amplifier, a phenomenon called stimulated Raman scattering is induced and thereby a gain value of the signal light is increased at a wavelength band including longer wavelengths than the center wavelength of the excitation light source by about 100 nm. Such amplification of signal light by the stimulated Raman scattering is called "Raman amplification".

FIG. 18 is a diagram illustrating the Raman amplification. In FIG. 18, the horizontal axis indicates a wavelength, and the vertical axis indicates power. As illustrated in FIG. 18, in the Raman amplification, signal light of the wavelength band including a center wavelength that is away from a center wavelength of the excitation light source to the long-wavelength side by about 100 nm is amplified. Amplified stimulated Raman scattering (ASS) that is a noise component of the stimulated Raman scattering, which is generated in the Raman amplification, is relatively small.

In order to properly amplify signal light of a desired wavelength band using the Raman amplifier, it is desirable that shift of the center wavelength of the excitation light source that is used to perform Raman amplification for the signal light is reduced. In consideration of this, a Raman amplifier is known in which a wavelength locker (fiber Bragg grating: FBG) is provided that fixes the center wavelength of the excitation light source that emits the excitation light. In the Raman amplifier with the FBG, a gain equalizer (GEQ) is often provided on an output side of the Raman amplifier to equalize gains of signal light, for a desired wavelength band, that is pumped by the Raman amplifier with an excitation light source.

However, the center wavelength of the excitation light source, which is fixed by the FBG varies when the temperature of an ambient environment (hereinafter, referred to as "environment temperature") such as a temperature of the FBG is changed. This is why the refraction index of an optical fiber included in the FBG has temperature dependence. When the center wavelength of the excitation light source, which is fixed by the FBG varies, the gain of the signal light that is pumped by the Raman amplifier with the excitation light source also varies. Consequently, it becomes difficult to equalize the gains by the GEQ, so that a case undesirably occurs in which it is difficult to maintain flatness of a profile of the gain deviation for the wavelengths.

As a technique to avoid such a case, a technique has been proposed that controls the temperature of the FBG to adjust the center wavelength of the excitation light source. In the technique, the FBG and an erbium-doped fiber (EDF) that is located downstream of the Raman amplifier are housed in a casing together, and the temperature of the FBG is adjusted by the temperature of the EDF. As a result, when the environment temperature is changed, shift of the center wavelength of the excitation light source, which is fixed by the FBG, may be reduced, and flatness of the profile of the gain deviation in the wavelength band may be maintained.

Japanese Laid-Open Patent Publication No. 2004-103599 is examples of the related art.

However, in the related art, it may remain difficult to accurately maintain flatness of the gain deviation profile in the wavelength band when the environment temperature is changed.

Specifically, in the related art, the temperature of the FBG is adjusted using the temperature change of the EDF, however, a temperature of the GEQ that is provided on the Raman amplifier output side is not considered when the temperature of the FBG is adjusted. The center wavelength of the wavelength band that is a target of gain equalization by the GEQ varies depending on the change of the environment temperature. Therefore, when the environment temperature is changed, the center wavelength of the excitation light source, which is fixed by the FBG, is not in accordance with the center wavelength of the wavelength band that is a target of gain equalization by the GEQ. As a result, in the related art, it may remain difficult to accurately maintain flatness of the gain deviation profile in the wavelength band.

SUMMARY

According to an aspect of the invention, an optical amplifier includes: a temperature-adjustment-unit that is provided in a wavelength-fixing-unit that fixes a center-wavelength of an excitation-light-source, and adjusts a temperature of the wavelength-fixing-unit, which causes the center-wavelength of the excitation-light-source to vary; a temperature-measurement-unit that measures the temperature of the wavelength-fixing-unit and a temperature of a gain-equalization-unit that equalizes gains of the signal-light on which the Raman amplification is performed using the excitation-light-source; a shift-amount-obtaining-unit that obtains a shift amount data of the center-wavelength of the excitation-light-source from a first-storage-unit and obtains a shift amount of the center-wavelength of the wavelength-band from a second-storage-unit; and a control unit that obtains a temperature-data of the-wavelength-fixing-unit, which corresponds to a difference between two shift amounts that are obtained by the shift amount obtaining unit, from the first-storage-unit, and controls the temperature of the wavelength-fixing-unit based on the obtained temperature-data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a table illustrating an example of information that is stored in a first shift amount storage unit;

FIG. 8 is a table illustrating a result that is obtained by measuring a temperature of each of the FBGs and the center wavelength of excitation light source at the temperature;

FIG. 9 is a table illustrating an example of information that is stored in a second shift amount storage unit;

FIG. 14 is a table illustrating an example of information that is stored in a third shift amount storage unit;

FIG. 15 is a table illustrating a result that is obtained by measuring a current value of drive current of each LD and the center wavelength of excitation light source for the current value;

DESCRIPTION OF EMBODIMENTS

The embodiments of the optical amplifier and the optical amplifier control method that are discussed herein are described in detail below with reference to the accompanying drawings. The technique discussed herein is not limited by the embodiments.

First Embodiment

Figure 1:
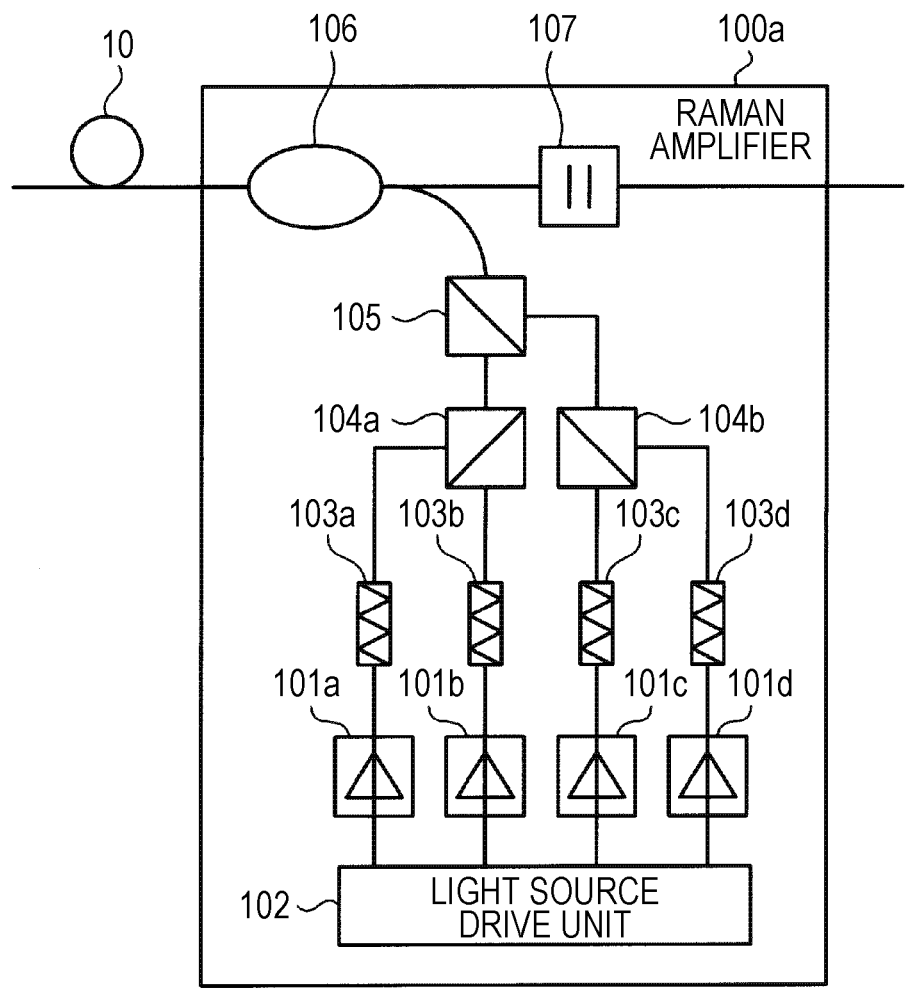
FIG. 1 is a diagram illustrating a configuration example of a common Raman amplifier.

A configuration of a common Raman amplifier is described before description of a configuration of a Raman amplifier according to the embodiments. FIG. 1 is a diagram illustrating a configuration example of a common Raman amplifier. In FIG. 1, as an example, a distributed Raman amplifier is described that amplifies signal light in an optical fiber, which is a transmission path, serving as an amplification medium.

A Raman amplifier 100a illustrated in FIG. 1 includes laser diodes (LDs) 101a to 101d, a light source drive unit 102, fiber Bragg gratings (FBGs) 103a to 103d, and polarization beam combiners (PBCs) 104a and 104b. In addition, the Raman amplifier 100a includes an excitation light multiplexer 105, a signal light/excitation light multiplexer 106, and a gain equalizer (GEQ) 107.

The LD 101a to 101d are light sources that output excitation light to be used to perform Raman amplification on wavelength division multiplexing (WDM) signal light passing through a transmission path 10. The light source drive unit 102 supplies drive current to the LD 101a to 101d.

The FBGs 103a to 103d fix center wavelengths of the respective excitation light sources by passing through light in a certain wavelength band of excitation light sources output from corresponding LD 101a to 101d. The FBGs 103a to 103d are respectively provided for the LDs 101a to 101d that emit excitation light. The FBGs 103a and the 103b output the excitation light, which has a fixed center wavelength, to the PBC 104a, and the FBGs 103c and 103d output the excitation light, which has a fixed center wavelength, to the PBC 104b. The FBGs 103a to 103d are examples of a wavelength fixing unit.

The PBC 104a multiplexes the excitation light from the FBG 103a and the excitation light from 103b that are output in mutually different polarization states, and outputs the obtained excitation light to the excitation light multiplexer 105. The PBC 104b multiplexes the excitation light from the FBG 103c and the excitation light from the FBG 103d that are output in mutually different polarization states, and outputs the obtained excitation light to the excitation light multiplexer 105.

The excitation light multiplexer 105 multiplexes the excitation light that is output from the PBC 104a and the excitation light source that is output from the PBC 104b, and outputs the obtained excitation light to the signal light/excitation light multiplexer 106.

The signal light/excitation light multiplexer 106 supplies the excitation light that is output from the excitation light multiplexer 105, to the transmission path 10, and multiplexes the excitation light and WDM signal light that passes through the transmission path 10. As a result, the Raman amplification is performed on the WDM signal light of a wavelength band including a wavelength that is away from the center wavelength of the excitation light source to the long-wavelength side by about 100 nm.

The GEQ 107 equalizes gains of the signal light on which the Raman amplification is performed by the signal light/excitation light multiplexer 106 for a certain wavelength band that is a target, and outputs the signal light after the equalization to the outside of the Raman amplifier 100a. The GEQ 107 is an example of a gain equalization unit. Hereinafter, a wavelength band that is a target of gain equalization performed by the GEQ 107 is referred to as "equalization wavelength band".

The problem with the Raman amplifier 100a illustrated in FIG. 1 is described below. The center wavelength of the excitation light source, which is fixed by each of the FBGs 103a to 103d varies when an environment temperature such as the temperatures of the FBGs 103a to 103d is changed. When the center wavelength of the excitation light source, which is fixed by the FBGs 103a to 103d, varies, the gain of the WDM signal light on which the Raman amplification is performed using the excitation light source varies, so that it is difficult to equalize the gains by the GEQ 107. As a result, it may remain difficult to maintain flatness of the gain deviation profile in the wavelength band.

Figure 2:
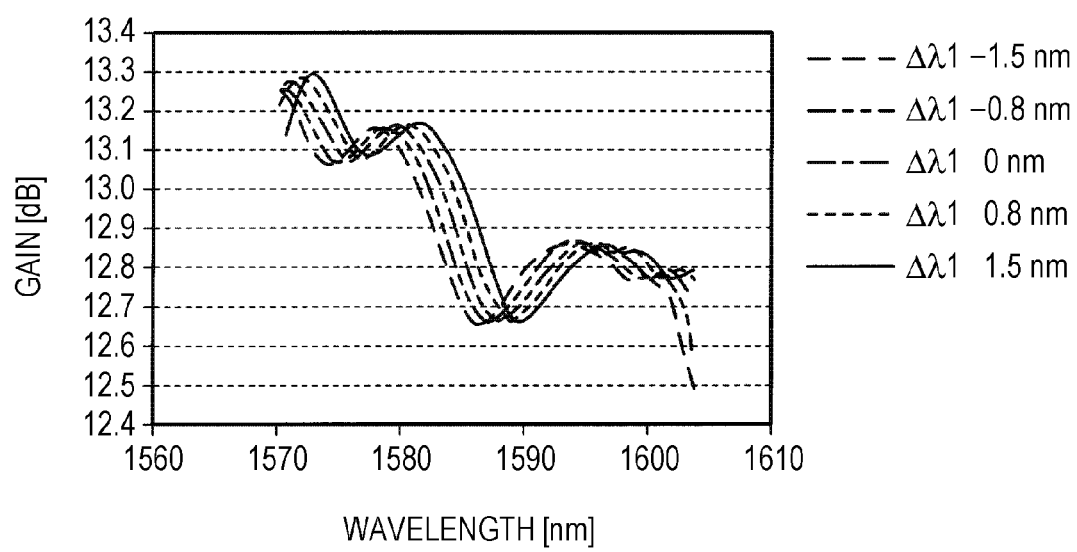
FIG. 2 is a diagram illustrating an example of gain profiles in a wavelength band of the common Raman amplifier.

FIG. 2 is a diagram illustrating an example of gain profiles in a wavelength band of the common Raman amplifier. In FIG. 2, the horizontal axis indicates a wavelength [nm], and the vertical axis indicates a gain [dB]. In addition, "Δλ1" indicates a shift of the center wavelength of the excitation light sources, which are respectively fixed by the FBGs 103a to 103d for the environment temperature. As illustrated in FIG. 2, "Δλ1" varies when the environment temperature is changed. With the shift of the center wavelength of the excitation light source, which is fixed by the FBGs 103a to 103d, a gain of the WDM signal light on which the Raman amplification is performed varies for wavelengths. Therefore, it is difficult to equalize the gains by the GEQ 107.

Figure 3:
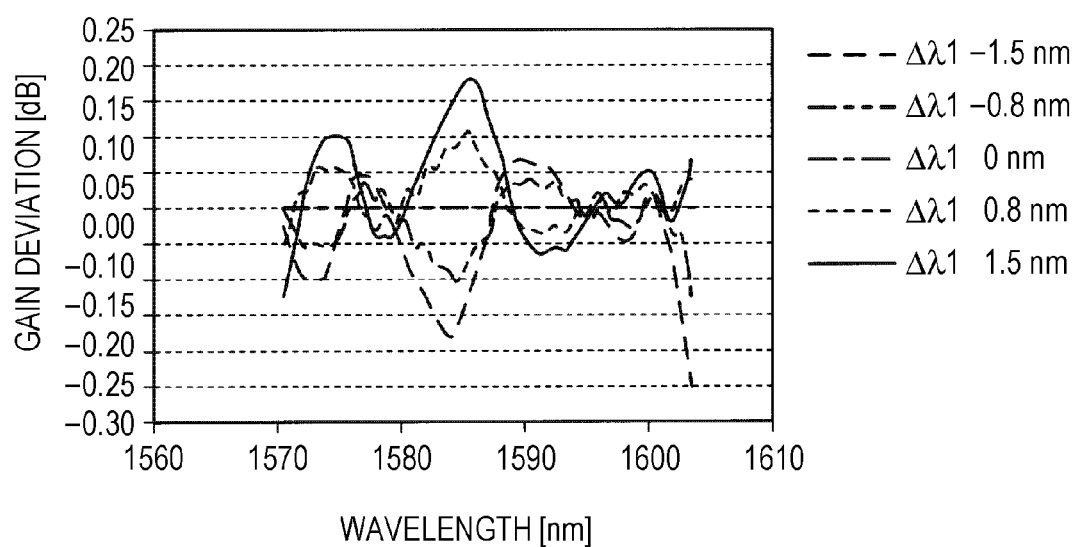
FIG. 3 is a diagram illustrating gain deviation profiles in the wavelength band in the common Raman amplifier when the temperature of an FBG is changed.

FIG. 3 is a diagram illustrating gain deviation profiles in the wavelength band in the common Raman amplifier when the temperature of FBG is changed. In FIG. 3, the horizontal axis indicates a wavelength [nm], and the vertical axis indicates gain deviation [dB]. In addition, "Δλ1" indicates a shift of the center wavelength of the excitation light source, which is fixed by each of the FBGs 103a to 103d for the environment temperature. In the example of FIG. 3, the center wavelength of an equalization wavelength band of the GEQ 107 is a fixed value regardless of change in the environment temperature. As illustrated in FIG. 3, when the center wavelength of the excitation light source, which is fixed by the FBGs 103a to 103d varies, a gain of the WDM signal light on which the Raman amplification is performed using the excitation light source varies, so that it is difficult to equalize the gains by the GEQ 107. As a result, as illustrated in FIG. 3, in the Raman amplifier 100a, the gain deviation profile in the wavelength band is not flattened. Such gain deviation is accumulated when the plurality of Raman amplifiers 100a are connected in cascade.

Figure 4:
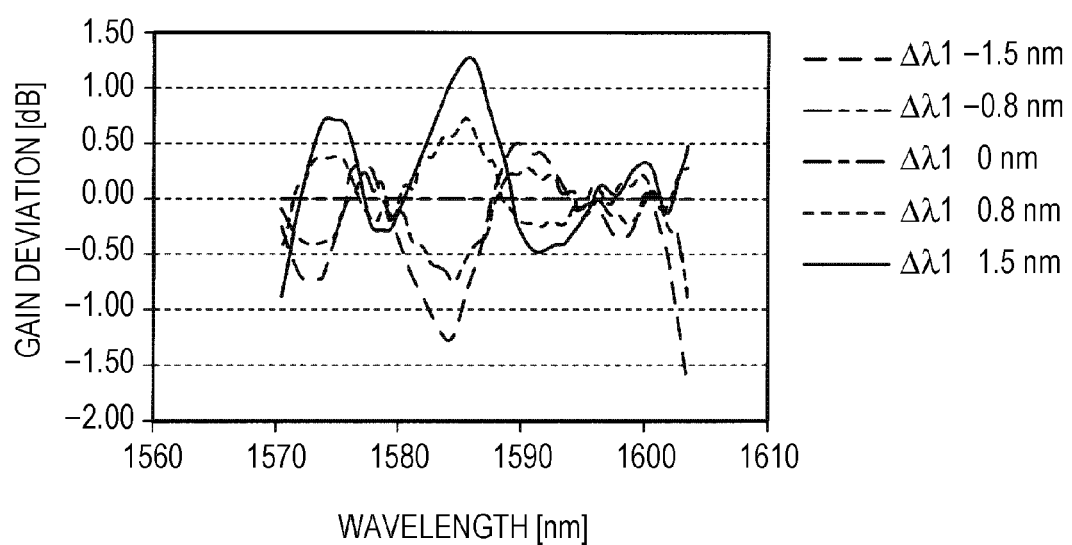
FIG. 4 is a diagram illustrating a cumulative value of gain deviation profiles in the wavelength band when the plurality of common Raman amplifiers are connected in cascade.

FIG. 4 is a diagram illustrating a cumulative value of gain deviation profiles in the wavelength band when the plurality of common Raman amplifiers are connected in cascade. In the example of FIG. 4, it is assumed that the seven Raman amplifiers 100a are connected each other. As illustrated in FIG. 4, cumulative gain deviation in the wavelength band becomes large as the number of the Raman amplifiers 100a connected in multi-stages increases.

As described above, in the common Raman amplifier 100a illustrated in FIG. 1, when the environment temperature is changed, it becomes difficult to maintain flatness of the gain deviation profile in the wavelength band. In order to avoid such a case, the temperature of each of the FBGs 103a to 103d, which causes the center wavelength of the excitation light source to vary may be adjusted using the temperature dependence of the center wavelength of the excitation light source. However, even when the temperature of the FBGs 103a to 103d are adjusted to an optimal value, the center wavelength of an equalization wavelength band of the GEQ 107 varies depending on the environment temperature. Therefore, the center wavelength of the excitation light source, which is fixed by the FBGs 103a to 103d, is not in accordance with the center wavelength of the equalization wavelength band of the GEQ 107. As a result, in the common Raman amplifier 100a, when the environment temperature is changed, it may remain difficult to maintain flatness of the gain deviation profile in the wavelength band.

Figure 5:
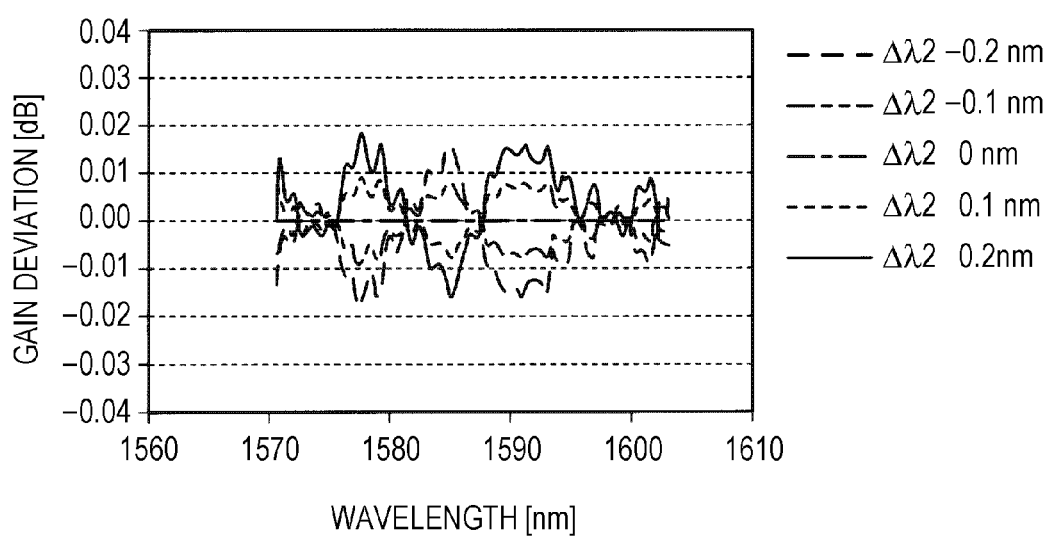
FIG. 5 is a diagram illustrating gain deviation profiles in the wavelength band in the common Raman amplifier when the temperature of a GEQ is changed.

FIG. 5 is a diagram illustrating gain deviation profile in the wavelength band in the common Raman amplifier when the temperature of the GEQ is changed. In FIG. 5, the horizontal axis indicates a wavelength [nm], and the vertical axis indicates gain deviation [dB]. In addition, "Δλ2" indicates a shift of the center wavelength of an equalization wavelength band of the GEQ 107 for the environment temperature. In the example of FIG. 5, it is assumed that the center wavelength of the excitation light source, which is fixed by the FBGs 103a to 103d, is a fixed value regardless of changes of the environment temperature. As illustrated in FIG. 5, when the center wavelength of the equalization wavelength band of the GEQ 107 varies, the center wavelength of the excitation light source, which is fixed by the FBGs 103a to 103d, is not in accordance with the center wavelength of the equalization wavelength band of the GEQ 107, so that it is difficult to equalize gains by the GEQ 107. As a result, in the Raman amplifier 100a, as illustrated in FIG. 5, gain deviation profile in the wavelength band is not flattened. That is, in the common Raman amplifier 100a, when the environment temperature is changed, it may remain difficult to maintain flatness of the gain deviation in the wavelength band.

In a Raman amplifier according to the embodiments discussed herein, the problems that are described with reference to FIGS. 2 to 5 may be avoided by executing desirable processing to perform temperature adjustment control of an FBG.

Figure 6:
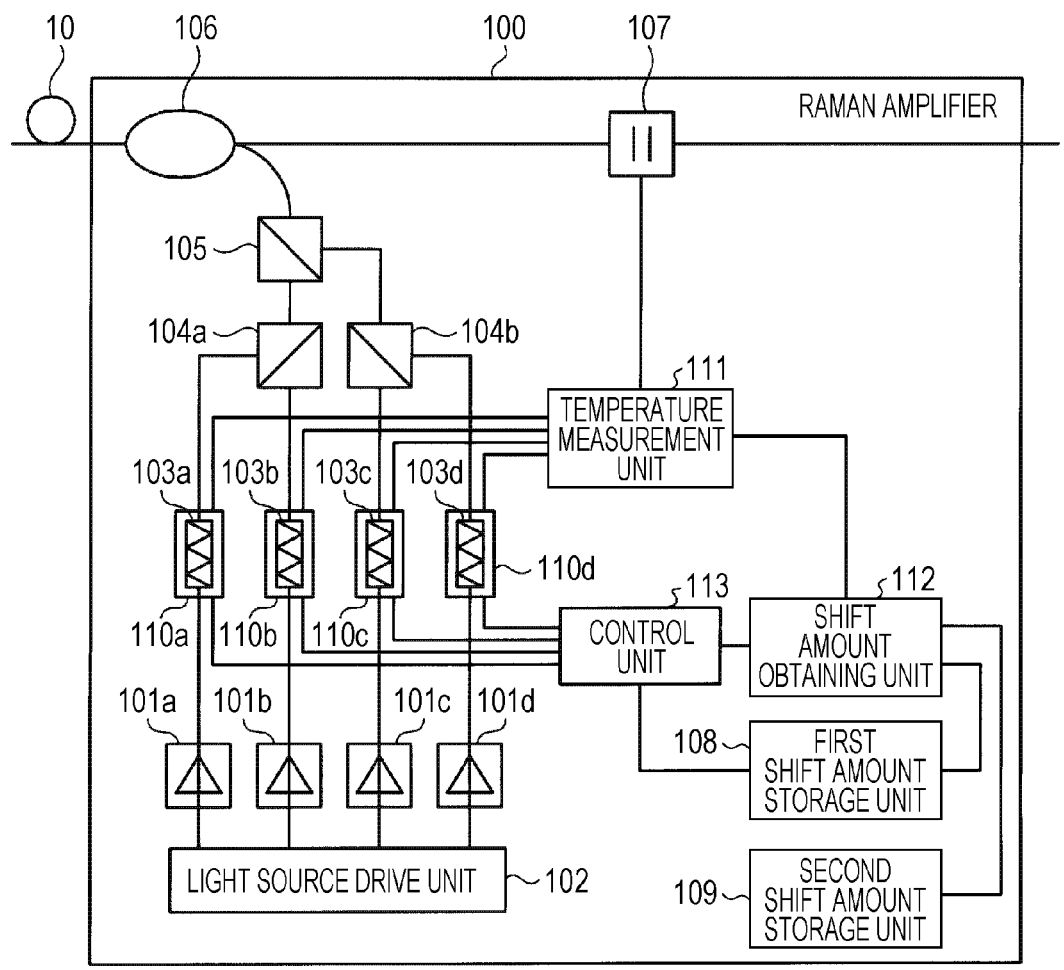
FIG. 6 is a diagram illustrating a configuration example of a Raman amplifier according to a first embodiment.

A configuration of a Raman amplifier according to the embodiments is described below. FIG. 6 is a diagram illustrating a configuration example of a Raman amplifier according to a first embodiment. In FIG. 6, similarly to the Raman amplifier 100a illustrated in FIG. 1, a distributed Raman amplifier is described as an example. As illustrated in FIG. 6, a Raman amplifier 100 according to the first embodiment includes LDs 101a to 101d, a light source drive unit 102, FBGs 103a to 103d, and PBCs 104a and 104b. In addition, the Raman amplifier 100 includes an excitation light multiplexer 105, a signal light/excitation light multiplexer 106, and a GEQ 107. In addition, the Raman amplifier 100 includes a first shift amount storage unit 108, a second shift amount storage unit 109, temperature adjustment units 110a to 110d, a temperature measurement unit 111, a shift amount obtaining unit 112, and a control unit 113.

In the Raman amplifier 100, the LDs 101a to 101d, the light source drive unit 102, the FBGs 103a to 103d, and the PBCs 104a and 104b respectively correspond to the LDs 101a to 101d, the light source drive unit 102, the FBGs 103a to 103d, and the PBCs 104a and 104b that are illustrated in FIG. 1. In addition, in the Raman amplifier 100, the excitation light multiplexer 105, the signal light/excitation light multiplexer 106, and the GEQ 107 respectively correspond to the excitation light multiplexer 105, the signal light/excitation light multiplexer 106, and the GEQ 107 that are illustrated in FIG. 1.

The first shift amount storage unit 108 is a memory unit that stores data on a relationship between a temperature and a shift amount of the center wavelength of the excitation light source of each FBG 103a to 103d. The first shift amount storage unit 108 is an example of a first storage unit. FIG. 7 is a table illustrating an example of information that is stored in the first shift amount storage unit 108. For example, as illustrated in FIG. 7, the first shift amount storage unit 108 stores data on a relationship between an FBG temperature [° C.] and a center wavelength shift [nm]. The FBG temperature means temperatures of the FBGs 103a to 103d that are located downstream of the LDs 101a to 101d, respectively. The center wavelength shift means shift amounts of the center wavelengths of the excitation light sources, which are fixed by respective FBGs 103a to 103d.

For example, according to the fourth column of the table stored in the first shift amount storage unit 108, a shift of the center wavelength of the excitation light source, which is fixed by the FBG 103a, is "0.00 nm" when the temperature of the FBG 103a located downstream of the LD 101a is "25° C.". Similarly, according to the fourth column of the table stored in the first shift amount storage unit 108, a shift of the center wavelength of the excitation light source, which is fixed by the FBG 103b, is "0.00 nm" when the temperature of the FBG 103b located downstream of the LD 101b is "25° C.". According to the fourth column of the table stored in the first shift amount storage unit 108, a shift of the center wavelength of the excitation light source, which is fixed by the FBG 103c, is "0.00 nm" when the temperature of the FBG 103c located downstream of the LD 101c is "25° C.". According to the fourth column of the table stored in the first shift amount storage unit 108, a shift of the center wavelength of the excitation light source, which is fixed by the FBG 103d, is "0.00 nm" when the temperature of the FBG 103d located downstream of the LD 101d is "25° C.".

Similarly, according to the third column of the table stored in the first shift amount storage unit 108, a shift of the center wavelength of the excitation light source, which is fixed by the FBG 103a, is "−0.23 nm" when the temperature of the FBG 103a located downstream of the LD 101a is "0° C.". Similarly, according to the third column of the table stored in the first shift amount storage unit 108, a shift of the center wavelength of the excitation light source, which is fixed by the FBG 103b, is "−0.23 nm" when the temperature of the FBG 103b located downstream of the LD 101b is "0° C.". According to the third column of the table stored in the first shift amount storage unit 108, a shift of the center wavelength of the excitation light source, which is fixed by the FBG 103c, is "−0.26 nm" when the temperature of the FBG 103c located downstream of the LD 101c is "0° C.". According to the third column of the table stored in the first shift amount storage unit 108, a shift of the center wavelength of the excitation light source, which is fixed by the FBG 103d, is "−0.24 nm" when the temperature of the FBG 103d that is located downstream of the LD 101d is "0° C.".

In addition, according to the fifth column of the first shift amount storage unit 108, a shift of the center wavelength of the excitation light source, which is fixed by the FBG 103a, is "0.14 nm" when the temperature of the FBG 103a located downstream of the LD 101a is "40° C.". Similarly, according to the fifth column of the first shift amount storage unit 108, a shift of the center wavelength of the excitation light source, which is fixed by the FBG 103b, is "0.17 nm" when the temperature of the FBG 103b located downstream of the LD 101b is "40° C.". According to the fifth column of the first shift amount storage unit 108, a shift of the center wavelength of the excitation light source, which is fixed by the FBG 103c, is "0.12 nm" when the temperature of the FBG 103c located downstream of the LD 101c is "40° C.". According to the fifth column of the first shift amount storage unit 108, a shift of the center wavelength of the excitation light source, which is fixed by the FBG 103d, is "0.14 nm" when the temperature of the FBG 103d located downstream of the LD 101d is "40° C.".

A setting method of information that is stored in the first shift amount storage unit 108 is described below. FIG. 8 is a table illustrating a result that is obtained by measuring a temperature of each of the FBGs 103a to 103d and the center wavelength of excitation light source at the temperature. As illustrated in FIG. 8, first, a designer of the Raman amplifier 100 creates a table using measurement data obtained by measuring the FBG temperature [° C.] and the center wavelength of the excitation light source [nm] at the time of manufacture, and the like, of the Raman amplifier 100. The FBG temperature means temperatures of each of the FBGs 103a to 103d that are respectively located downstream of the LDs 101a to 101d. Each of the center wavelengths of the excitation light sources is fixed by respective FBGs 103a to 103d. After that, the designer selects a temperature of "25° C.", the optimal temperature of the FBG, as a reference at which a gain profile in a wavelength band is flattened in the Raman amplifier 100. Then, the designer calculates a difference value between the center wavelength of the excitation light source under another FBG temperature and the reference selected above. After that, the designer sets the calculated difference value as a shift amount of the center wavelength for the table in the first shift amount storage unit 108.

Returning to the description of FIG. 6, the second shift amount storage unit 109 is a memory unit that stores data on a relationship between a temperature and a shift amount of the center wavelength of an equalization wavelength band of the GEQ 107. The second shift amount storage unit 109 is an example of a second storage unit. FIG. 9 is a table illustrating an example of information that is stored in the second shift amount storage unit 109. For example, as illustrated in FIG. 9, the second shift amount storage unit 109 stores data on a relationship between a GEQ temperature [° C.] and a center wavelength shift [nm]. The GEQ temperature means a temperature of the GEQ 107. The center wavelength shift amount means shift amount of the center wavelength of an equalization wavelength band of the GEQ 107.

For example, according to the fourth column of the table stored in the second shift amount storage unit 109, a shift of the center wavelength of the equalization wavelength band is "0.00 nm" when the temperature of the GEQ 107 is "25° C.". Similarly, according to the third column of the second shift amount storage unit 109, a shift of the center wavelength of the equalization wavelength band is "−0.11 nm" when the temperature of the GEQ 107 is "0° C.". Similarly, according to the fifth column of the second shift amount storage unit 109, a shift of the center wavelength of the equalization wavelength band is "0.06 nm" when the temperature of the GEQ 107 is "40° C.".

A setting method of information that is stored in the second shift amount storage unit 109 is described below. First, the designer of the Raman amplifier 100 creates a table using measurement data obtained by measuring a temperature of the GEQ 107 and the center wavelength of an equalization wavelength band, at the time of manufacture, and the like of the Raman amplifier 100. After that, the designer selects a temperature of "25° C.", the optimal temperature of the GEQ 107, as a reference at which a gain profile in a wavelength band is flattened in the Raman amplifier 100. Then, the designer calculates a difference value between the center wavelength of the equalization wavelength band for another GEQ 107 temperature and the reference value selected above. After that, the designer sets the calculated difference value as a shift amount of the center wavelength for the table in the second shift amount storage unit 109.

The temperature adjustment units 110a to 110d are respectively provided in the FBGs 103a to 103d and respectively adjust temperatures of the FBGs 103a to 103d which cause the center wavelengths of the excitation light source to vary. The temperatures of the FBGs 103a to 103d, which are respectively adjusted by the temperature adjustment units 110a to 110d are controlled, for example, by the control unit 113. That is, the temperature adjustment units 110a to 110d respectively adjust the temperatures of the FBGs 103a to 103d on the basis of the control by the control unit 113.

Figure 10:
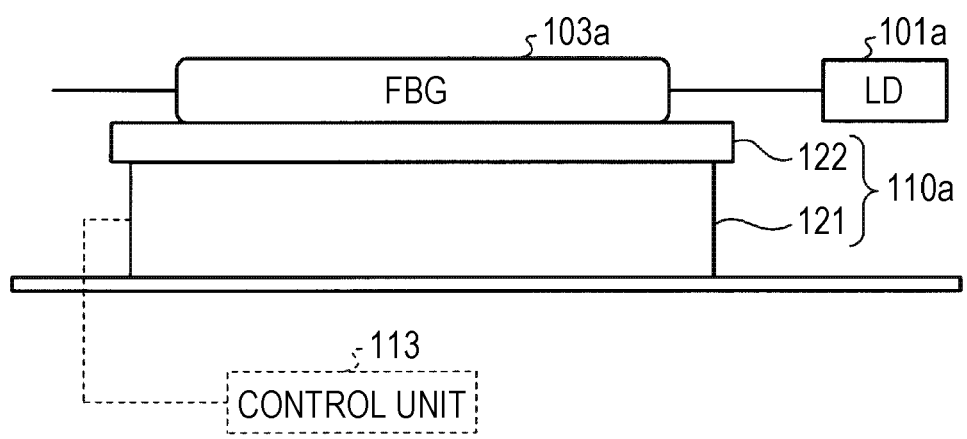
FIG. 10 is a diagram illustrating a configuration example of a temperature adjustment unit.

FIG. 10 is a diagram illustrating a configuration example of the temperature adjustment unit 110a. The configurations of the temperature adjustment units 110b to 110d are similar to the configuration of the temperature adjustment unit 110a. As illustrated in FIG. 10, the temperature adjustment unit 110a includes a temperature control device 121 such as a thermoelectric cooler or a thermoelectric heater that is mounted on a substrate, and a temperature diffusion plate 122 such as a metal that is mounted on the temperature control device 121, and supports the FBG 103a using the temperature diffusion plate 122. The temperature control device 121 is connected to the control unit 113 and adjusts the temperature of the FBG 103a by heating or cooling the FBG 103a through the temperature diffusion plate 122, on the basis of the control by the control unit 113. The temperature diffusion plate 122 uniformly diffuses heat that passes between the temperature control device 121 and the FBG 103a.

The temperature measurement unit 111 measures the temperatures of the FBGs 103a to 103d and the temperature of the GEQ 107 and outputs the measurement results on temperature to the shift amount obtaining unit 112. Here, the temperature measurement unit 111 may use a temperature sensor such as a thermistor.

The shift amount obtaining unit 112 obtains a shift amount data of the center wavelength of the excitation light source, which corresponds to the temperature of the FBGs 103a to 103d, which is measured by the temperature measurement unit 111, from the first shift amount storage unit 108, and outputs the obtained shift amount data of the center wavelength of the excitation light source, to the control unit 113. In addition, the shift amount obtaining unit 112 obtains a shift amount data of the center wavelength of the equalization wavelength band, which corresponds to the temperature of the GEQ 107, which is measured by the temperature measurement unit 111, from the second shift amount storage unit 109, and outputs the obtained shift amount data of the center wavelength of the equalization wavelength band, to the control unit 113.

For example, the shift amount obtaining unit 112 obtains a shift amount "0.35 nm" of the center wavelength of the excitation light source of the LD 101a, from the first shift amount storage unit 108 and outputs the obtained shift amount data to the control unit 113 when the temperature of the FBG 103a measured by the temperature measurement unit 111 is "60° C.". In addition, for example, the shift amount obtaining unit 112 obtains a shift amount "0.06 nm" of the center wavelength of the equalization wavelength band, from the second shift amount storage unit 109 and outputs the obtained shift amount data to the control unit 113 when the temperature of the GEQ 107 measured by the temperature measurement unit 111 is "40° C.". The shift amount obtaining unit 112 is realized by a central processing unit (CPU) and a program that is analyzed and executed on the CPU. Alternatively, the shift amount obtaining unit 112 may be realized using a field programmable gate array (FPGA).

The control unit 113 obtains temperature data of the FBGs 103a to 103d, which correspond to differences between the two shift amounts that are obtained by the shift amount obtaining unit 112, from the first shift amount storage unit 108. The control unit 113 controls the temperature of FBGs 103a to 103d that are respectively adjusted by the temperature adjustment units 110a to 110d, on the basis of the temperature data that is obtained from the first shift amount storage unit 108.

For example, the control unit 113 obtains a shift amount "0.35 nm" of the center wavelength of the excitation light source of the LD 101a and a shift amount "0.06 nm" of the center wavelength of the equalization wavelength band of the GEQ 107, from the shift amount obtaining unit 112. The control unit 113 calculates a difference "0.29 nm" between the obtained shift amount data of the center wavelength of the excitation light source of the LD 101a and the obtained shift amount data of the center wavelength of the equalization wavelength band of the GEQ 107. The control unit 113 obtains an FBG temperature data that corresponds to the calculated difference "0.29 nm" of the two shift amounts, from the first shift amount storage unit 108. The control unit 113 controls the temperature of the FBG 103a, which is adjusted by the temperature adjustment unit 110a so that the temperature that is obtained from the first shift amount storage unit 108 becomes the optimal temperature "25° C.".

When, in the first shift amount storage unit 108, there does not exist the temperature data of the FBGs 103a to 103d, which corresponds to the difference between the two shift amounts of the wavelength that are obtained by the shift amount obtaining unit 112, the control unit 113 may execute the following processing. That is, the control unit 113 generates an interpolation function that indicates a correspondence relationship between the temperature of each of the FBGs 103a to 103d and a shift amount of the center wavelength of the excitation light source on the basis of the information that is stored in the first shift amount storage unit 108. The control unit 113 obtains a temperature data of the FBGs 103a to 103d by applying the difference between the two shift amounts of the wavelength that are obtained by the shift amount obtaining unit 112 using the generated interpolation function. The control unit 113 controls the temperature of the FBGs 103a to 103d that are respectively adjusted by the temperature adjustment units 110a to 110d, on the basis of the obtained temperature.

Figure 11:
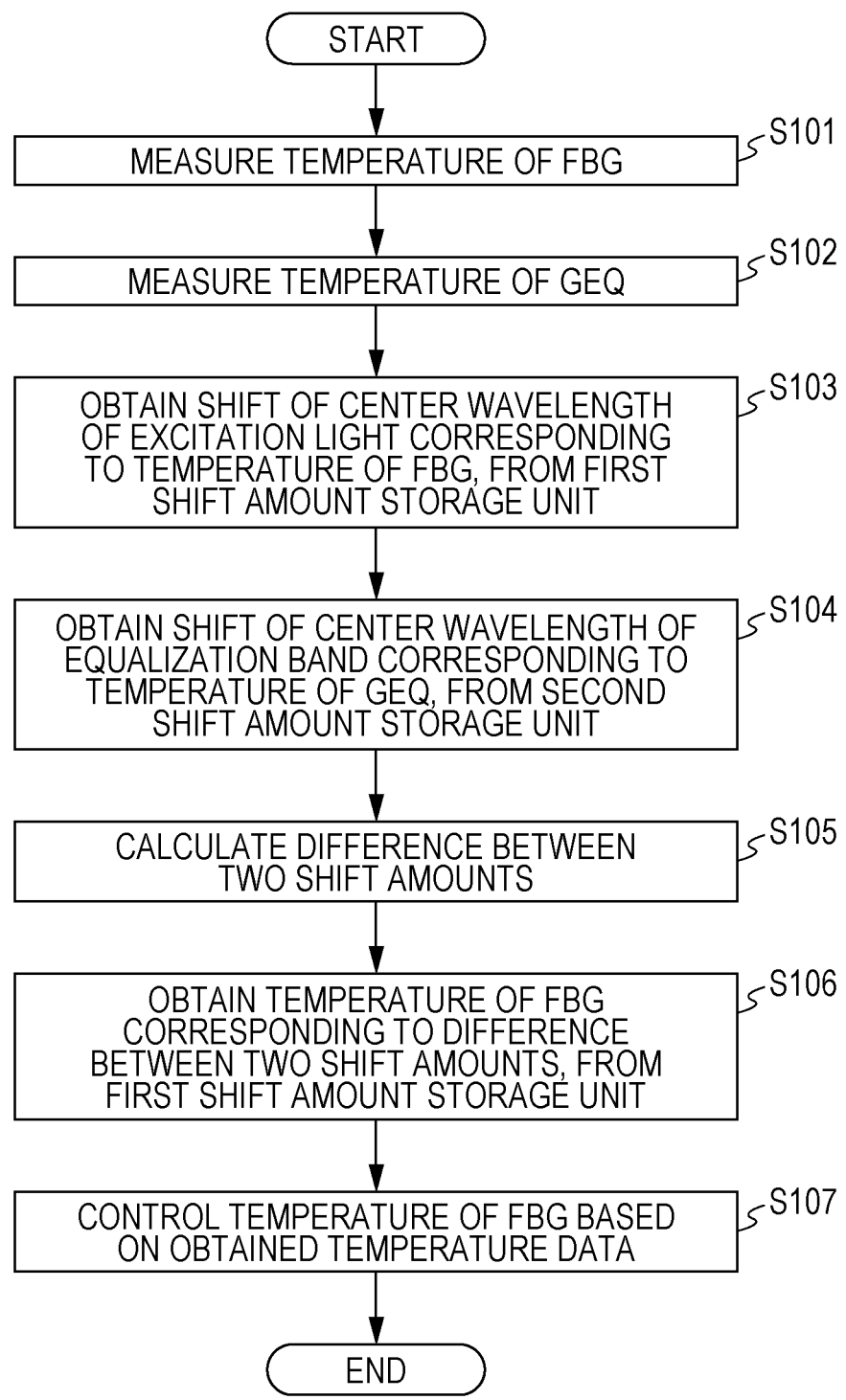
FIG. 11 is a flowchart illustrating a processing procedure of the Raman amplifier according to the first embodiment.

The processing procedure of the Raman amplifier 100 according to the first embodiment is described below with reference to FIG. 11. FIG. 11 is a flowchart illustrating the processing procedure of the Raman amplifier 100 according to the first embodiment. For example, the processing illustrated in FIG. 11 is executed at a certain cycle.

As illustrated in FIG. 11, the Raman amplifier 100 measures a temperature of the FBGs 103a to 103d (Step S101) and measures a temperature of the GEQ 107 (Step S102).

After that, the Raman amplifier 100 obtains a shift amount data of the center wavelength of the excitation light source, which corresponds to the measured temperature of each of the FBGs 103a to 103d, from the first shift amount storage unit 108 (Step S103). The Raman amplifier 100 obtains a shift amount data of the center wavelength of the equalization wavelength band, which corresponds to the measured temperature of the GEQ 107, from the second shift amount storage unit 109 (Step S104).

After that, the Raman amplifier 100 calculates a difference between the obtained two shift amounts (Step S105) and obtains a temperature of each of the FBGs 103a to 103d, which corresponds to the calculated difference of the two shift amounts, from the first shift amount storage unit 108 (Step S106). In addition, the Raman amplifier 100 controls the temperature of each of the FBGs 103a to 103d that are respectively adjusted by the temperature adjustment units 110a to 110d, on the basis of the temperature that is obtained from the first shift amount storage unit 108 (Step S107).

As described above, the Raman amplifier 100 measures a temperature of the FBG and a temperature of the GEQ and obtains a shift amount data of the center wavelength of the excitation light source, which corresponds to the measured temperature of the FBG, from the first shift amount storage unit 108 and obtains a shift amount data of the center wavelength of the equalization wavelength band, which corresponds to the temperature of the GEQ from the second shift amount storage unit 109. In addition, the Raman amplifier 100 obtains a temperature of the FBG, which corresponds to a difference of the obtained two shift amounts, from the first shift amount storage unit 108, and controls the temperature of the FBG using the obtained temperature. Therefore, even when the environment temperature is changed, in the Raman amplifier 100, it may be avoided that the center wavelength of the excitation light source, which is fixed by the FBG is not in accordance with the center wavelength of the wavelength band that is a target of gain equalization by the GEQ. As a result, even when the environment temperature is changed, the Raman amplifier 100 may accurately maintain flatness of the gain deviation profile in the wavelength band.

Application Example

Figure 12:
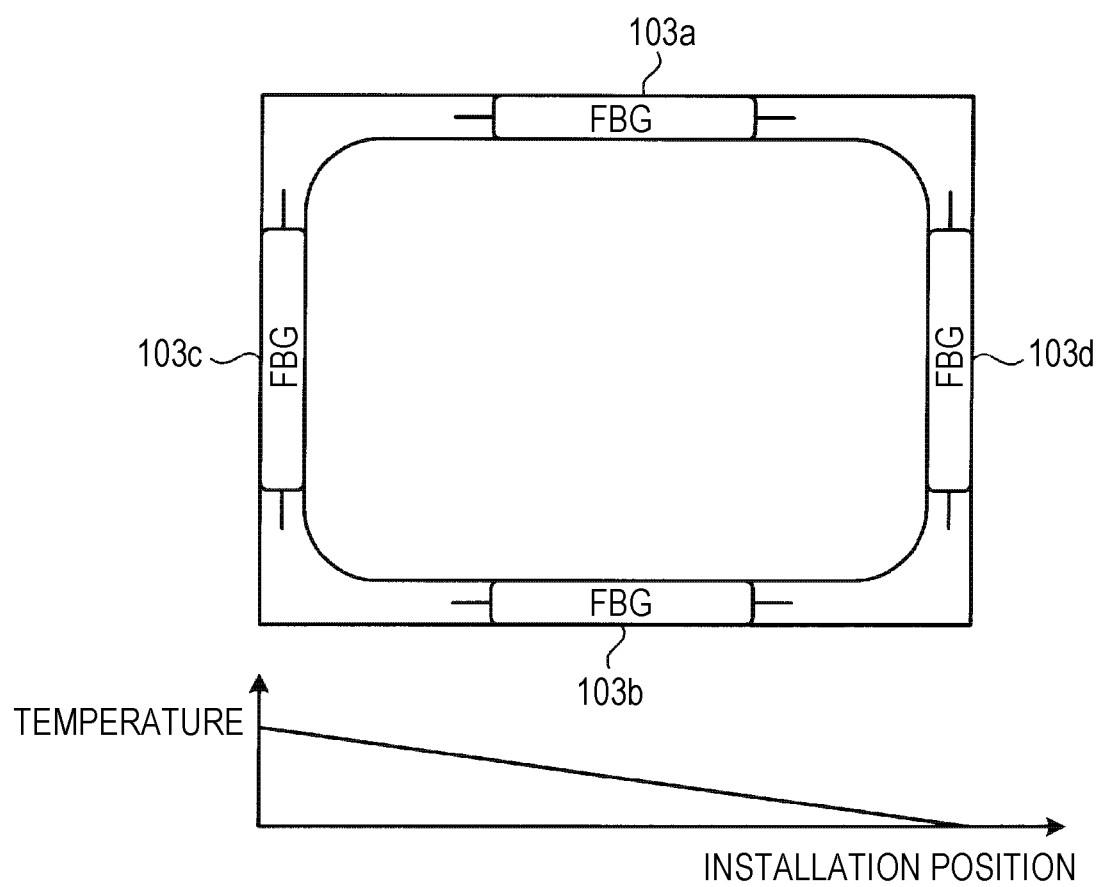
FIG. 12 is a diagram illustrating an application example of the Raman amplifier according to the first embodiment.

An application example of the Raman amplifier 100 is described below. FIG. 12 is a diagram illustrating an application example of the Raman amplifier 100 according to the first embodiment. In the example of FIG. 12, in the Raman amplifier 100, the FBGs 103a to 103d are respectively provided in different installation positions, a temperature gradient related to the installation positions is generated. For example, the temperature of the FBG 103a is substantially the same as the temperature of the FBG 103b, and the temperature of the FBG 103c is higher than the temperature of the FBG 103d. Under such a condition, the Raman amplifier 100 controls the respective temperatures of FBGs 103a to 103d, individually. Therefore, the Raman amplifier 100 may accurately maintain flatness of the gain deviation profile in the wavelength band even when the temperature gradient is generated between the FBGs 103a and 103d.

Second Embodiment

As described above, in the first embodiment, the case is described in which a temperature of the FBG is controlled based on a difference between a shift amount of the center wavelength of the excitation light source for a temperature of the FBG, and a shift amount of the center wavelength of the equalization wavelength band for a temperature of the GEQ. In addition, alternatively, the temperature of the FBG may be controlled using a current value of drive current to drive an excitation light source and a shift amount data of the center wavelength of the excitation light source for the current value. In a second embodiment, the case is described in which the temperature of the FBG is controlled using a current value of drive current to drive an excitation light source and a shift amount data of the center wavelength of the excitation light source for the current value.

Figure 13:
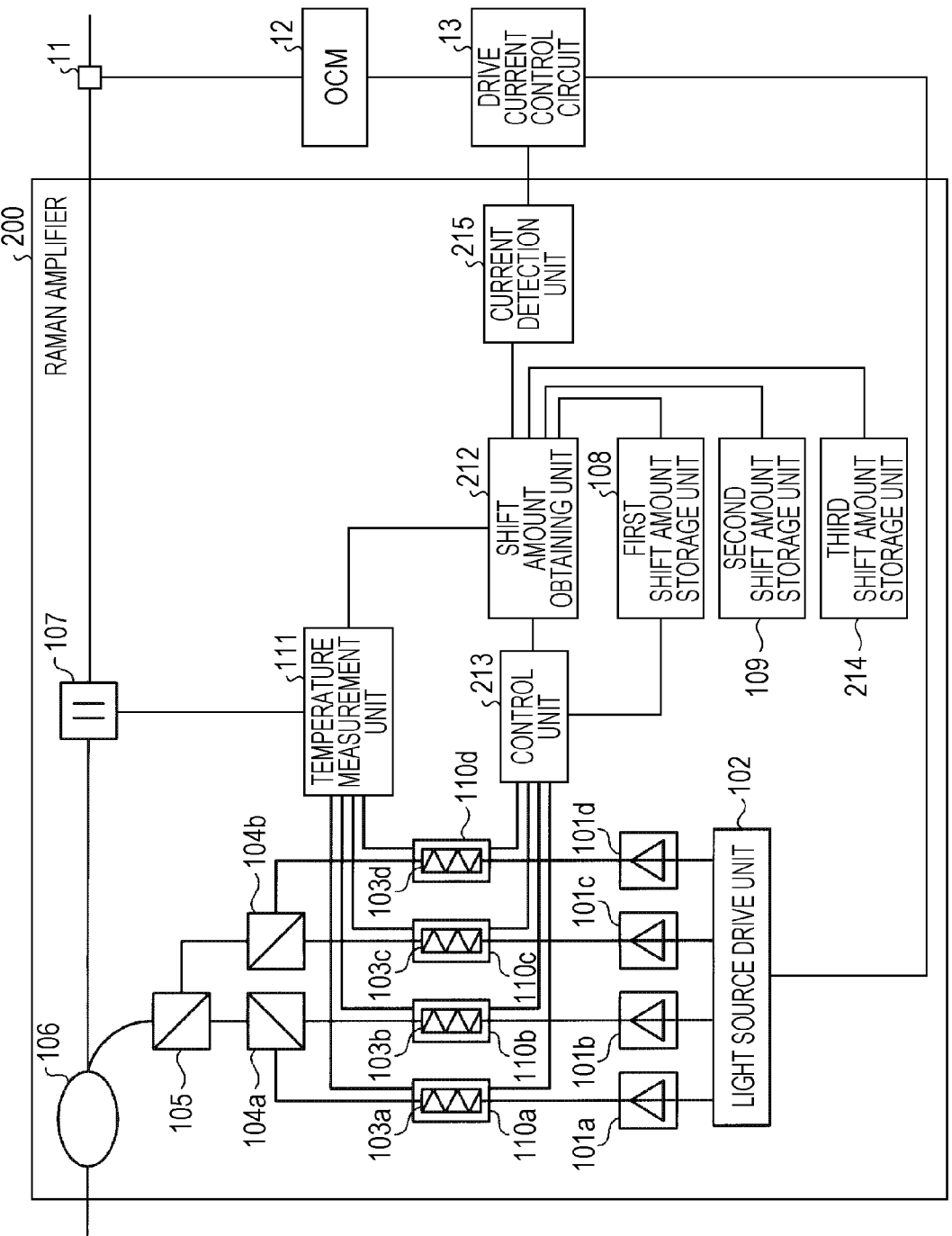
FIG. 13 is a diagram illustrating a configuration example of a Raman amplifier according to a second embodiment.

A configuration of a Raman amplifier according to a second embodiment is described below with reference to FIG. 13. FIG. 13 is a diagram illustrating a configuration example of the Raman amplifier according to the second embodiment. In FIG. 13, similar to the first embodiment, a distributed Raman amplifier is described as an example. In addition, in FIG. 13, the same reference numerals are given to blocks including the same functions as that of FIG. 6, and the description of the same processing is omitted herein.

As illustrated in FIG. 13, a coupler 11, an optical channel monitor (OCM) 12, and a drive current control circuit 13 are located downstream of a Raman amplifier 200 according to the second embodiment. The coupler 11 demultiplexes the WDM signal light that is output from the Raman amplifier 200 and outputs one of the parts of demultiplexed WDM signal light, to the OCM 12. The OCM 12 detects power of WDM signal light for each wavelength and outputs data of the detection result to the drive current control circuit 13. The drive current control circuit 13 determines a current value of drive current to drive the LDs 101a to 101d so that the parts of power of WDM signal light for the respective wavelengths are equalized, on the basis of the detection result from the OCM 12, and outputs the determined current to the light source drive unit 102 of the Raman amplifier 200.

The Raman amplifier 200 includes LDs 101a to 101d, a light source drive unit 102, FBGs 103a to 103d, and PBCs 104a and 104b. In addition, the Raman amplifier 200 includes an excitation light multiplexer 105, a signal light/excitation light multiplexer 106, and a GEQ 107. In addition, the Raman amplifier 200 includes a first shift amount storage unit 108, a second shift amount storage unit 109, temperature adjustment units 110a to 110d, a temperature measurement unit 111, a shift amount obtaining unit 212, and a control unit 213. In addition, the Raman amplifier 100 includes a third shift amount storage unit 214 and a current detection unit 215.

The third shift amount storage unit 214 is, for example, a memory unit that stores data on a relationship between a current value of the drive current for the LDs 101a to 101d and a shift amount of the center wavelength of the excitation light source. The third shift amount storage unit 214 is an example of a third storage unit. FIG. 14 is a table illustrating an example of information that is stored in the third shift amount storage unit 214. For example, as illustrated in FIG. 14, the third shift amount storage unit 214 stores data on a relationship between an LD current value [mA] and a center wavelength shift [nm]. The LD current value means a current value of the drive current for the LDs 101a to 101d. The center wavelength shift means a shift of the center wavelengths of the excitation light sources that are output from the LDs 101a to 101d.

For example, according to the second column of the table stored in the third shift amount storage unit 214, a shift of the center wavelength of the excitation light source that is output from the LD 101a is "0.00 nm" when a drive current of the LD 101a is "500 mA". Similarly, according to the second column of the table stored in the third shift amount storage unit 214, a shift of the center wavelength of the excitation light source that is output from the LD 101b is "0.00 nm" when a drive current of the LD 101b is "500 mA". Similarly, according to the second column of the table stored in the third shift amount storage unit 214, a shift of the center wavelength of the excitation light source that is output from the LD 101c is "0.00 nm" when a drive current of the LD 101c is "500 mA". Similarly, according to the second column of the table stored in the third shift amount storage unit 214, a shift of the center wavelength of the excitation light source that is output from the LD 101d is "0.00 nm" when a drive current of the LD 101d is "500 mA".

Similarly, according to the third column of the table stored in the third shift amount storage unit 214, a shift of the center wavelength of the excitation light source that is output from the LD 101a is "0.20 nm" when a drive current of the LD 101a is "1000 mA". Similarly, according to the third column of the table stored in the third shift amount storage unit 214, a shift of the center wavelength of the excitation light source that is output from the LD 101b is "0.17 nm" when a drive current of the LD 101b is "1000 mA". Similarly, according to the third column of the table stored in the third shift amount storage unit 214, a shift of the center wavelength of the excitation light source that is output from the LD 101c is "0.13 nm" when a drive current of the LD 101c is "1000 mA". Similarly, according to the third column of the table stored in the third shift amount storage unit 214, a shift of the center wavelength of the excitation light source that is output from the LD 101d is "0.21 nm" when a drive current of the LD 101d is "1000 mA".

A setting method of information that is stored in the third shift amount storage unit 214 is described below. FIG. 15 is a table illustrating a result that is obtained by measuring a current value of drive current of each of the LDs 101a to 101d and the center wavelength of excitation light source for the current value. As illustrated in FIG. 15, first, the designer of the Raman amplifier 200 creates a table using measurement data obtained by measuring an LD current value [mA] and the center wavelength of excitation light source [nm] at the time of manufacture, and the like, of the Raman amplifier 200. The LD current value means a current value of drive current of each of the LDs 101a to 101d. The center wavelength of excitation light source means the center wavelength of excitation light source that is output from each of the LDs 101a to 101d. After that, the designer selects a electric current value of "500 mA", the optimal current value, as a reference at which a gain profile in a wavelength band is flattened in the Raman amplifier 200. Then, the designer calculates a difference value between the center wavelength of the excitation light source under another LD current value and the reference value. After that, the designer sets the calculated difference value as a shift amount of the center wavelength for the table in the third shift amount storage unit 214.

Returning to the description of FIG. 13, the current detection unit 215 monitors the drive current control circuit 13, detects a current value of drive current of each of the LDs 101a to 101d, and outputs data of the detected current value to the shift amount obtaining unit 212. The current detection unit 215 is realized by the CPU and the program that is analyzed and executed on the CPU. Alternatively, the current detection unit 215 may be realized using the FPGA.

The shift amount obtaining unit 212 corresponds to the shift amount obtaining unit 112 illustrated in FIG. 6. In addition, the shift amount obtaining unit 212 obtains a shift amount data of the center wavelength of the excitation light source, which corresponds to the current value of drive current for the LDs 101a to 101d detected by the current detection unit 215, from the third shift amount storage unit 214, and outputs the obtained data on shift amount of the center wavelength of the excitation light source, to the control unit 213.

For example, when a current value of the drive current of the LD 101a, which is detected by the current detection unit 215, is "1000 mA", the shift amount obtaining unit 212 obtains a shift amount "0.20 nm" of the center wavelength of the excitation light source of the LD 101a, from the third shift amount storage unit 214 and outputs the obtained shift amount data to the control unit 213.

The control unit 213 correspond to the control unit 113 that is illustrated in FIG. 6. In addition, the control unit 213 obtains temperature data of each of the FBGs 103a to 103d, which correspond to the shift amount data that are obtained by the shift amount obtaining unit 212, from the first shift amount storage unit 108. The control unit 213 controls the temperature of each of the FBGs 103a to 103d that are respectively adjusted by the temperature adjustment units 110a to 110d on the basis of the temperature that is obtained from the first shift amount storage unit 108.

For example, the control unit 213 accepts a shift amount "0.20 nm" of the center wavelength of the excitation light source of the LD 101a, from the shift amount obtaining unit 212. The control unit 213 obtains FBG temperature data that correspond to the shift amount "0.20 nm" of the center wavelength of the excitation light source of the LD 101a, from the first shift amount storage unit 108. The control unit 213 controls the temperature of the FBG 103a, which is adjusted by the temperature adjustment unit 110a so that the temperature that is obtained from the first shift amount storage unit 108 becomes the optimal temperature "25° C."

When, in the first shift amount storage unit 108, there does not exist a temperature data on the FBGs 103a to 103d, which correspond to the shift amounts that are obtained by the shift amount obtaining unit 212, the control unit 213 may execute the following processing. That is, the control unit 213 generates an interpolation function that indicates a correspondence relationship between a temperature of each of the FBGs 103a to 103d and a shift amount of the center wavelength of the excitation light source, on the basis of the information that is stored in the first shift amount storage unit 108. The control unit 213 obtains a temperature data of each of the FBGs 103a to 103d by applying the shift amount data that are obtained by the shift amount obtaining unit 212 to the generated interpolation function. The control unit 213 controls the temperature of each of the FBGs 103a to 103d that are respectively adjusted by the temperature adjustment units 110a to 110d, on the basis of the obtained temperature.

Figure 16:
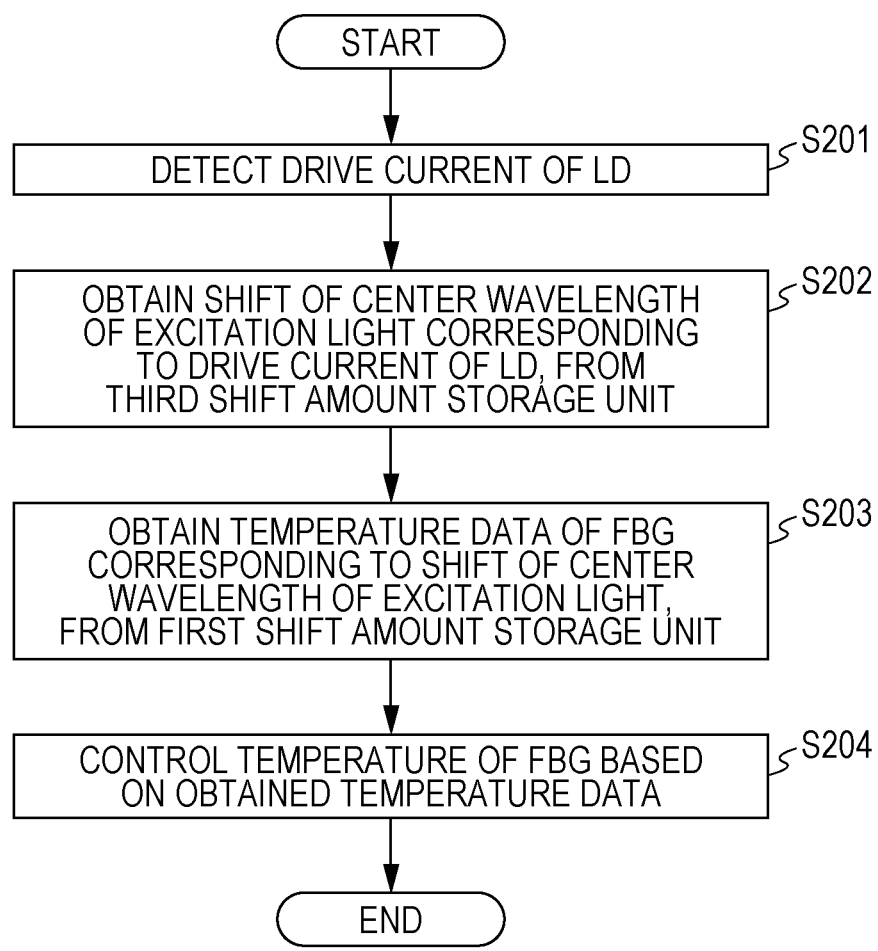
FIG. 16 is a flowchart illustrating a processing procedure of the Raman amplifier according to the second embodiment.

The processing procedure of the Raman amplifier 200 according to the second embodiment is described below with reference to FIG. 16. FIG. 16 is a flowchart illustrating the processing procedure of the Raman amplifier 200 according to the second embodiment. For example, the processing illustrated in FIG. 16 is executed at a certain cycle. In addition, the processing illustrated in FIG. 16 may be executed with the processing illustrated in FIG. 11 together, and may be executed independently of the processing illustrated in FIG. 11.

As illustrated in FIG. 16, the Raman amplifier 200 detects a current value of drive current of each of the LDs 101a to 101d (Step S201). After that, the Raman amplifier 200 obtains a shift amount data of the center wavelength of the excitation light source, which correspond to the detected current value of the drive current of each of the LDs 101a to 101d, from the third shift amount storage unit 214 (Step S202).

After that, the Raman amplifier 200 obtains a temperature data of each of the FBGs 103a to 103d, which corresponds to the obtained shift amount data of the center wavelength of the excitation light source, from the first shift amount storage unit 108 (Step S203). In addition, the Raman amplifier 200 controls the temperature of each of the FBGs 103a to 103d that are respectively adjusted by the temperature adjustment units 110a to 110d, on the basis of the temperature that is obtained from the first shift amount storage unit 108 (Step S204).

As described above, the Raman amplifier 200 detects a current value of the drive current of each of the LDs and obtains a shift amount data of the center wavelength of the excitation light source, which corresponds to the detected current value, from the third shift amount storage unit 214. In addition, the Raman amplifier 200 obtains a temperature data of the FBG, which corresponds to the obtained shift amount data, from the first shift amount storage unit 108, and controls the temperature of the FBG using the obtained temperature data. Therefore, the Raman amplifier 200 may reduce shift amount of the center wavelength of the excitation light source, which is fixed by the FBG even when drive current that drives an LD emitting excitation light is changed. As a result, the Raman amplifier 200 may accurately maintain flatness of the gain deviation profile in the wavelength band even when the drive current of the LD emitting excitation light is changed.

Figure 17:
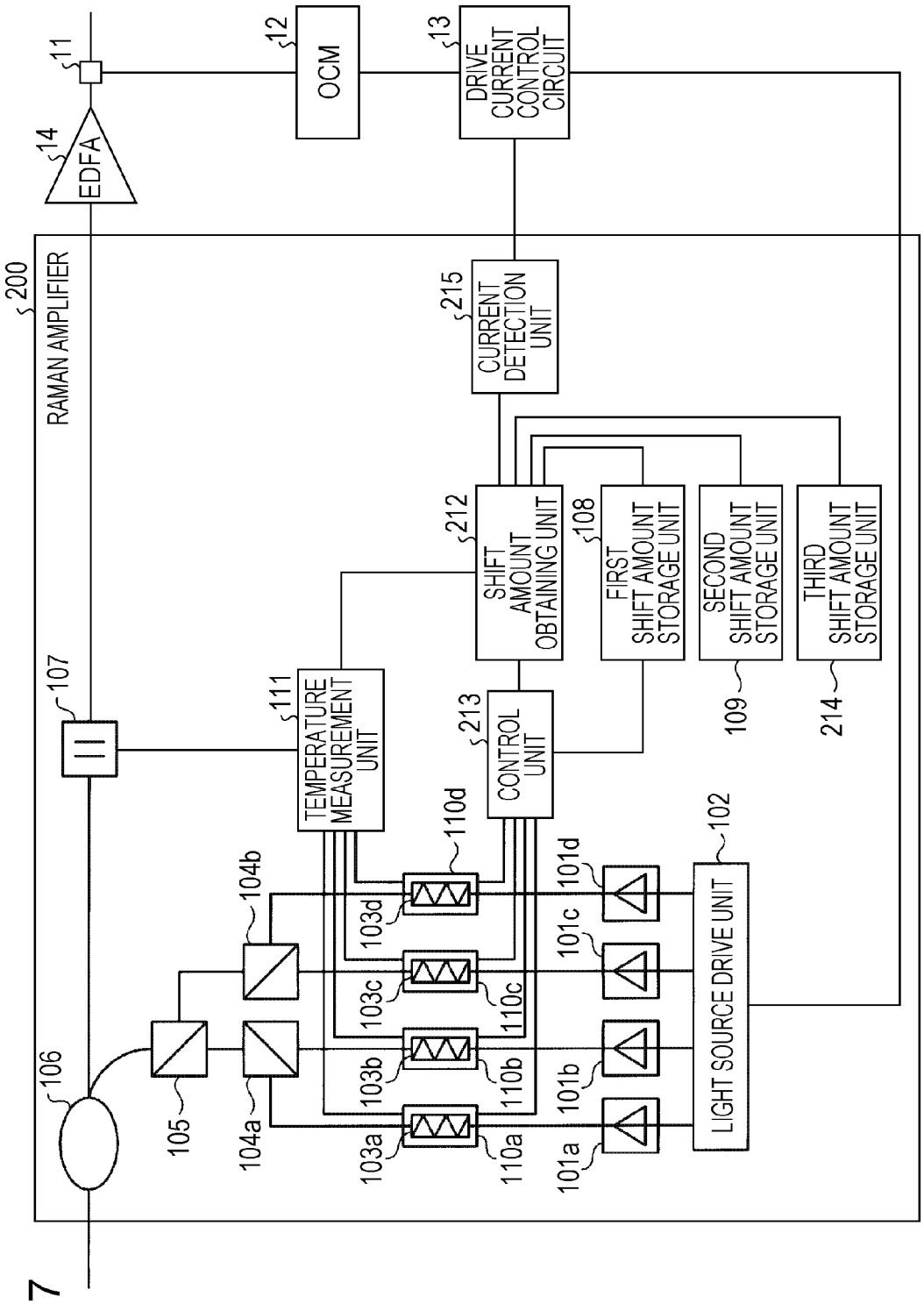
FIG. 17 is a diagram illustrating a modification of the second embodiment.
Figure 18:
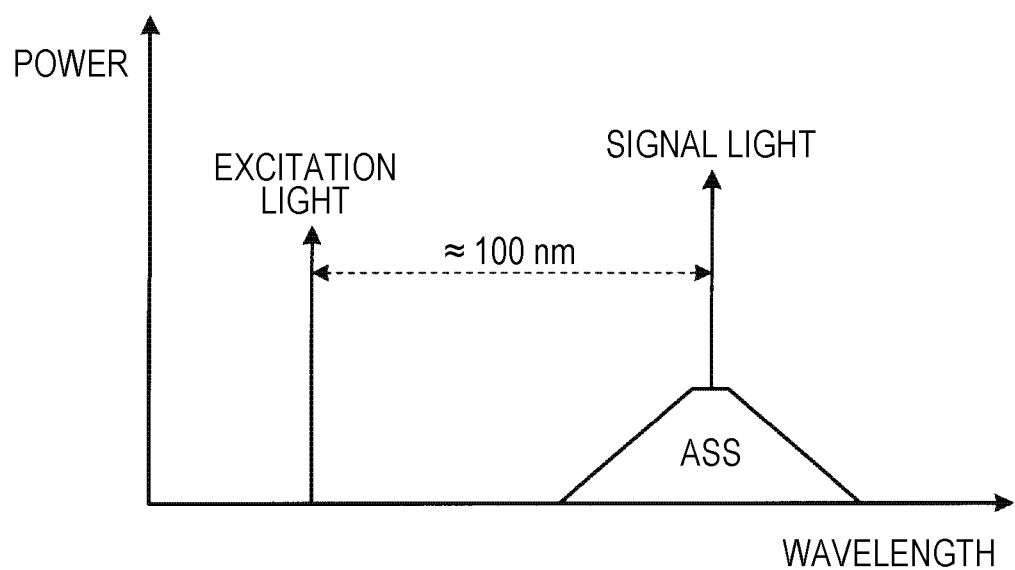
FIG. 18 is a diagram illustrating Raman amplification.

In a modification of the second embodiment, even when another optical component is located downstream of the Raman amplifier 200, effects similar to the above-described second embodiment may be obtained. For example, as illustrated in FIG. 17, an erbium-doped fiber amplifier (EDFA) 14 may be located downstream of the Raman amplifier 200. In the configuration, gain tilt, and the like, that is generated in the EDFA 14 may be compensated. FIG. 17 is a diagram illustrating the modification of the second embodiment.

In addition, in the above-described first and second embodiments, the example is described in which the optical amplifier discussed herein is applied to the distributed Raman amplifier that amplifies signal light using an optical fiber that is a transmission path as an amplification medium. Alternatively, the optical amplifier discussed herein may be applied to the centralized type Raman amplifier that amplifies signal light using a high non-linear fiber having a high non-linear refraction index, a dispersion compensation fiber, and the like, as an amplification medium.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical amplifier comprising:
a temperature adjustment unit that is provided in a wavelength fixing unit that fixes a center wavelength of an excitation light source that is used to perform Raman amplification on signal light, and adjusts a temperature of the wavelength fixing unit, which causes the center wavelength of the excitation light source to vary;
a temperature measurement unit that measures the temperature of the wavelength fixing unit and a temperature of a gain equalization unit that equalizes gains of the signal light in a certain wavelength band on which the Raman amplification is performed using the excitation light source;
a shift amount obtaining unit that obtains a shift amount data of the center wavelength of the excitation light source, which corresponds to a temperature of the wavelength fixing unit, which is measured by the temperature measurement unit, from a first storage unit that stores data on a relationship between a temperature of the wavelength fixing unit and a shift amount of the center wavelength of the excitation light source at the temperature, and obtains a shift amount of the center wavelength of the wavelength band, which corresponds to the measured temperature of the gain equalization unit, from a second storage unit that stores data on a relationship between a temperature of the gain equalization unit and a shift amount of the center wavelength of the wavelength band at the temperature; and
a control unit that obtains a temperature data of the wavelength fixing unit, which corresponds to a difference between two shift amounts that are obtained by the shift amount obtaining unit, from the first storage unit, and controls the temperature of the wavelength fixing unit that is adjusted by the temperature adjustment unit, based on the obtained temperature data.

2. The optical amplifier according to claim 1, wherein
the plurality of wavelength fixing units are respectively provided in the light sources that emit excitation light, and the temperature adjustment units are respectively provided in the wavelength fixing units so as to adjust the temperatures of the wavelength fixing units,
the temperature measurement unit measures a temperature of each of the wavelength fixing units and a temperature of the gain equalization unit,
the shift amount obtaining unit obtains a shift amount data of the center wavelength of the excitation light source, which corresponds to the temperature of each of the wavelength fixing units, which is measured by the temperature measurement unit, from the first storage that stores data on a relationship between a temperature of each of the wavelength fixing units and a shift of the center wavelength of the excitation light source at the temperature, and obtains a shift amount data of the center wavelength of the wavelength band, which corresponds to the measured temperature of the gain equalization unit, from the second storage unit, and the control unit obtains a temperature data of each of the wavelength fixing units, which corresponds to a difference between the two shift amounts that are obtained by the shift amount obtaining unit, from the first storage unit, and controls the temperature of each of the wavelength fixing units that are respectively adjusted by the temperature adjustment units, based on the obtained temperature data.

3. The optical amplifier according to claim 1, further comprising:
a current detection unit that detects a drive current that is used to drive the light source that emits excitation light, wherein
the shift amount obtaining unit obtains a shift of the center wavelength of the excitation light source, which corresponds to the current value of the drive current detected by the current detection unit, from a third storage unit that stores data on a relationship between a drive current and a shift of the center wavelength of the excitation light source under the current value, and
the control unit obtains a temperature data of the wavelength fixing unit, which corresponds to the shift amount that is obtained by the shift amount obtaining unit, from the first storage unit, and controls the temperature of the wavelength fixing unit that is adjusted by the temperature adjustment unit, based on the obtained temperature data.

4. The optical amplifier according to claim 3, wherein
the plurality of wavelength fixing units are respectively provided in the light sources that emit excitation light, and the temperature adjustment units are respectively provided in the wavelength fixing units so as to adjust the temperatures of the wavelength fixing units,
the current detection unit detects the drive current for each of the light sources,
the shift amount obtaining unit obtains a shift amount data of the center wavelength of the excitation light source, which corresponds to the current value of the drive current for each of the light sources, which is detected by the current detection unit, from the third storage unit that stores data on a relationship between the drive current for each of the light sources and a shift of the center wavelength of the excitation light source for the current value, and
the control unit obtains a temperature data of each of the wavelength fixing units, which corresponds to the shift amount that is obtained by the shift amount obtaining unit, from the third storage unit, and controls the temperature of each of the wavelength fixing units that are respectively adjusted by the temperature adjustment units, based on the obtained temperature data.

5. An optical amplifier control method that is executed by an optical amplifier including a temperature adjustment unit that is provided in a wavelength fixing unit that fixes a center wavelength of an excitation light source that is used to perform Raman amplification on signal light, and adjusts a temperature of the wavelength fixing unit, which causes the center wavelength of the excitation light source to vary, the method comprising:
measuring a temperature of the wavelength fixing unit and a temperature of a gain equalization unit that equalizes gains of the signal light in a certain wavelength band on which the Raman amplification is performed using the excitation light source;
obtaining a shift amount data of the center wavelength of the excitation light source, which corresponds to a measured temperature of the wavelength fixing unit, from a first storage unit that stores data on a relationship between a temperature of the wavelength fixing unit and a shift of the center wavelength of the excitation light source at the temperature, and obtaining a shift amount data of the center wavelength of the wavelength band, which corresponds to the measured temperature of the gain equalization unit, from a second storage unit that stores data on a relationship between a temperature of the gain equalization unit and a shift of the center wavelength of the wavelength band for the temperature; and
obtaining a temperature data of the wavelength fixing unit, which corresponds to a difference between the obtained two shift amounts, from the first storage unit, and controlling the temperature of the wavelength fixing unit that is adjusted by the temperature adjustment unit, based on the obtained temperature data.

* * * * *

UNITED STATES PATENT AND TRADEMARK OFFICE
CERTIFICATE OF CORRECTION

PATENT NO. : 8,902,492 B2
APPLICATION NO. : 13/870305
DATED : December 2, 2014
INVENTOR(S) : Yuichi Suzuki Page 1 of 1

It is certified that error appears in the above-identified patent and that said Letters Patent is hereby corrected as shown below:

On the Title Page

Column 2, Item [57] (Abstract), line 15, Delete "the-wavelength-fixing-unit," and insert -- the wavelength-fixing-unit, --, therefor.

Signed and Sealed this
Fifth Day of May, 2015

Michelle K. Lee
*Director of the United States Patent and Trademark Office*